Dec. 2, 1958 R. LANDRON, JR 2,863,104

SEMICONDUCTOR COMPONENTS AND THEIR MANUFACTURE

Filed June 18, 1954 2 Sheets-Sheet 1

INVENTOR.
RAFAEL LANDRON JR.
BY Clarence R. Patty, Jr.
ATTORNEY.

Inventor
RAFAEL LANDRON JR.

BY Clarence R. Patty, Jr.
Attorney 2,863,104

SEMICONDUCTOR COMPONENTS AND THEIR MANUFACTURE

Rafael Landron, Jr., Corning, N. Y., assignor to Corning Glass Works, Corning, N. Y., a corporation of New York Application June 18, 1954, Serial No. 437,759

7 Claims. (Cl. 317—234)

The present invention relates to semiconductor components and is particularly concerned with the provision of components which readily lend themselves to being hermetically sealed in all-vitreous housings.

Although glass is an ideal material for the support of and housing for such components, so far as applicant is aware, none of the components proposed prior to the present invention lend themesives to manufacture in all-glass or similar vitreous materials.

A major problem in the manufacture of semiconductor components hermetically sealed within a vitreous housing is the provision of an assembly design and/or method of manufacture making it practicable to assemble and hermetically seal the crystal thereof within such a housing without exceeding the maximum permissible temperature at the crystal position. Although the industry is not wholly agreed as to the critical temperature at the crystal position, it is generally accepted that the maximum temperature of 100° C., attained in accordance with the present invention as applied to transistor manufacture, is well within the safe maximum temperature that can be tolerated at such position. The manufacture of diodes presents a somewhat less difficult problem, since a somewhat higher temperature at the crystal position is permissible.

According to the present invention an entire transistor assembly comprises the usually required three or more conductors and a crystal supported by a vitreous bead arranged within the housing, preferably although not necessarily tubular in form, and within which the crystal is hermetically sealed at the housing entrance by a sealing plug comprising a bead through which the conductors are passed. The final step of assembly is the fusion of the sealing bead to the region of the housing bordering its entrance and about the conductors which are passed therethrough to hermetically seal the crystal from the exterior atmosphere. Excessive heating of the area occupied by the crystal is in part avoided by employment of a vitreous sealing bead having a low melting point and in part by extracting heat from the area occupied by the crystal during the application of the necessary sealing heat to the bead.

In the manufacture of junction transistor assemblies, satisfactory results have been attained by employing a crystal supporting bead and a housing composed of a glass having a softening point of approximately 630° C. and a plug or sealing bead having a softening point of approximately 375° C. Alternatively it is posible if found desirable to dispense with the sealing bead, in which instance the housing cavity depth and the conductor supporting bead height are so proportioned as to bring the top of the conductor supporting bead approximately level with the top of the housing. Only such firing of the bead as is required to effect hermetic seals about the conductors in their region of issuance from the bead and between it and the upper edge of the housing is necessary under these circumstances. In the latter form of structure the single beam employed is preferably composed of a glas having a melting point of 375° C. or less.

In manufacture, the necessary crystal supporting conductors are conveniently initially passed through a suitable multi-bore bead and fired only to the extent required to anchor the conductors thereto. A crystal is then suitably attached to the conductor ends projecting from one end of the bead and the crystal and bead assembly introduced into the housing. Preferably the housing bore has a reduced cross-section in the region to be occupied by the crystal, with the crystal supporting bead being adapted to rest on a ledge at the juncture of the two bore diameters. If such bead is to be employed also as the housing plug, as previously stated it extends to the top of the housing wall. On the other hand if a separate sealing bead or plug is to be used the crystal supporting bead may be somewhat shorter, with the sealing bead arranged thereon and extending to the top of the housing wall. The minimum length of bead is, of course, determined by the ability to effect a seal without objectionably heating the crystal. After assembly, the housing is preferably slowly rotated about its bore axis while a suitable flame is directed to the sealing bead to fuse it to the extent necessary to seal it about the conductors passing therethrough and to the adjoining top edge of the housing wall. During the sealing operation cooling fluid, ordinarily air, which may or may not be refrigerated preferably directed toward the general region of the housing occupied by the crystal to keep its temperature well within that safely permissible.

According to the invention, as applied to the manufacture of a diode assembly, the housing has an unrestricted outwardly flared open end and a heavy walled bottom. Moreover, the bottom wall has an externally protruding central portion of reduced cross-section and has a perforation therethrough through which a crystal supporting conductor, introduced into the housing, is passed as necessary to bring the crystal against the inner surface of the housing bottom. This construction makes it possible to direct a needle flame toward the protruding portion of the housing bottom while slowly rotating the housing about its axis to thus soften and hermetically seal the glass immediately surrounding the conductor thereto without the transmittal of an objectionable amount of heat to the crystal. If desired, however, cooling fluid may be directed toward the housing region occupied by the crystal as intransistor assembly manufacture. The closure for the open end of the housing conveniently comprises a plug tapered to match the taper of the housing wall and at the large end has a flange of the diameter of the housing exterior. An axial passage is provided in the plug for the usual point contact (whisker) supporting wire or rod which preferably has a freely slidable fit in the plug aperture. The plug is preferably composed of a low point temperature melting glass such as used for the sealing bead of a transistor assembly, so that it can be readily fused to the flange engaged surfaces of the housing while the necessary heat is applied to the plug to hermetically seal it about the contact support. During the sealing operation pressure is ordinarily applied to the outer end of such support in accordance with the contact (whisker) pressure desired.

The respective vitreous parts of the foregoing semiconductor components may be made in any desired fashion. They can, however, be most economically molded cold from powdered vitreous materials and then fired into vitreous bodies.

For a better understanding of the invention reference is made to the accompanying drawing in which:

Fig. 6 also illustrates a chuck from which such support is suspended.

Figure 1:
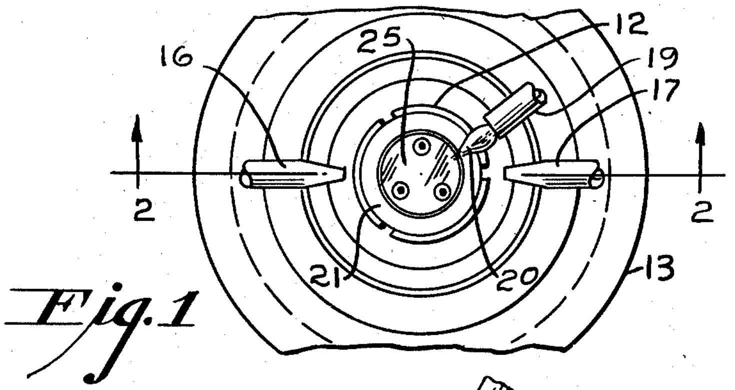
Fig. 1 is a top plan view, on an enlarged scale, of equipment, suitable for use in hermetically sealing a transistor crystal in a vitreous housing and provided with a chuck containing a transistor assembly embodying the invention.
Figure 2:
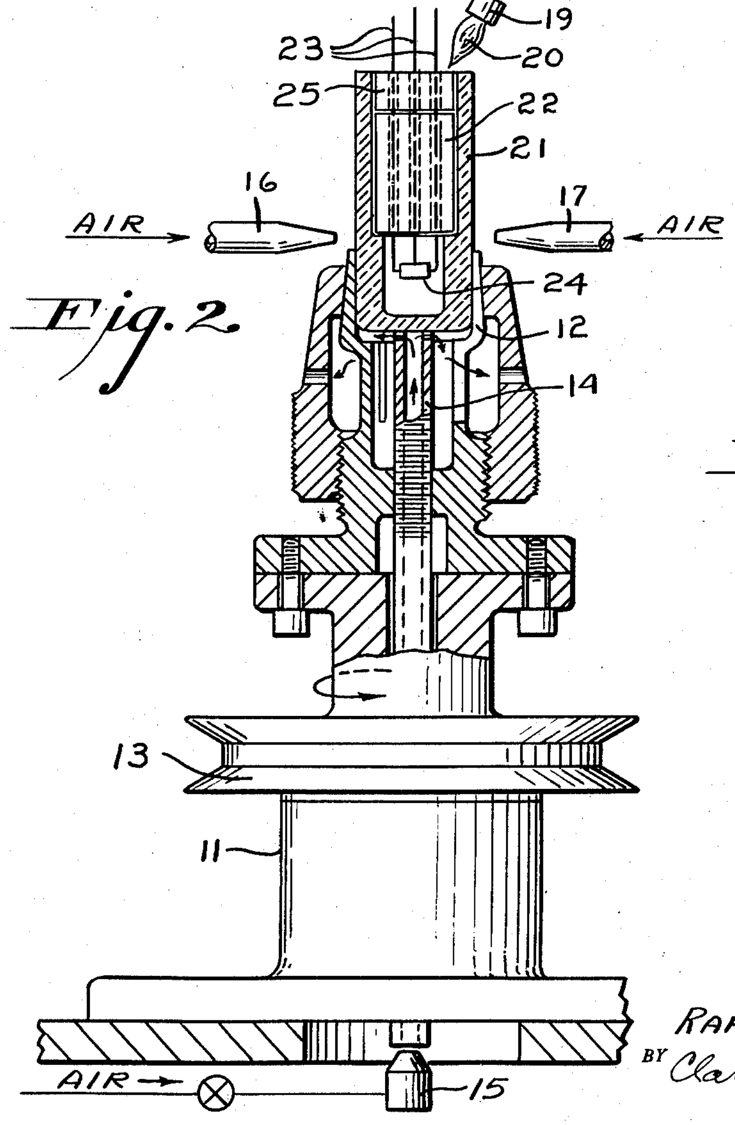
Fig. 2 is a sectional view taken generally on line 2—2 of Fig. 1.

Referring particularly to Figs. 1 and 2, the equipment embodies a support 11 in which is mounted a suitable chuck 12 adapted for rotation through the medium of a drive pulley 13. For the purpose of directing a cooling medium toward the bottom surface of a transistor assembly housing, such as 21 held by chuck 12, there is provided a tube 14 which is supplied with a suitable cooling medium by a nozzle 15. Similar nozzles 16 and 17 are positioned to also direct a cooling medium toward the transistor housing sidewall. A burner 19 arranged above the housing 21 is adapted to provide a sealing flame 20.

Arranged within housing 21 is a multi-bore bead 22 containing conductors 23 which at their lower ends support a crystal 24. The upper ends of conductors 23 pass through the bores of a multi-bore sealing bead 25. The frame 20 is positioned to direct the necessary sealing heat into bead 25 to seal it about the respective conductors 23 and to the surrounding wall of housing 21 as the transistor assembly is slowly rotated. As will be understood, during the sealing operation, cooling fluid is directed toward the region of housing 21 occupied by crystal 24 from tube 14 and nozzles 16 and 17.

Figure 3:
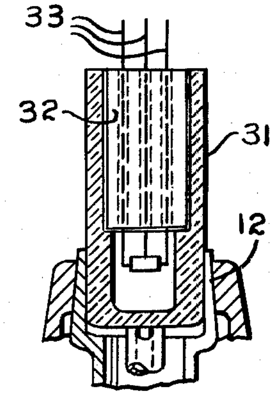
Fig. 3 is a view similar to Fig. 2, of a fragment of the equipment, with the chuck containing an alternative form of transistor assembly embodying the invention.

In Fig. 3 the transistor structure differs from that shown in Fig. 2 only in that its housing 31 contains a multi-bore bead 32 of a composition such as that of bead 25 and of the combined length of beads 22 and 25. Bead 32 thus jointly functions as a support for the conductors 33 and as the sealing plug or bead. The method of sealing is identical to that described with respect to Fig. 2. As will be obvious, the securing of conductors into sealing bead 32 before its introduction into housing 31 may at the same time effectively seal the bead about such conductors so that only sealing of the bead to the periphery of the outer end of such housing will be necessary.

Figure 4:
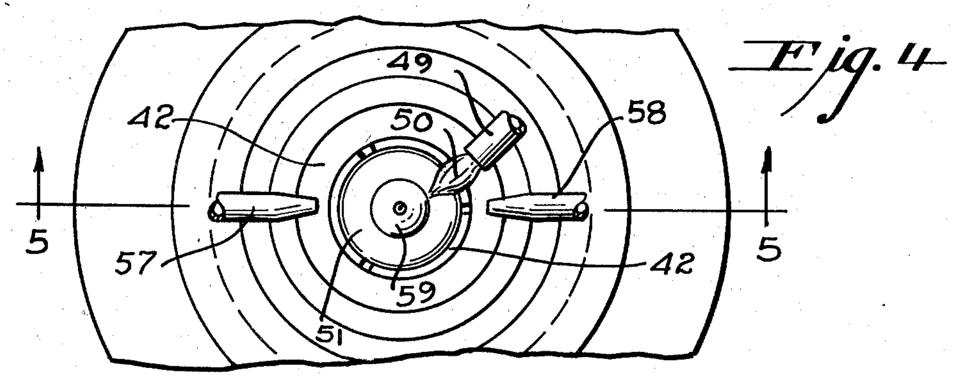
Fig. 4 is a plan view of equipment similar to that shown in Fig. 1, but whose chuck contains a diode housing embodying the invention containing a crystal and a crystal support.
Figures 5, 6:
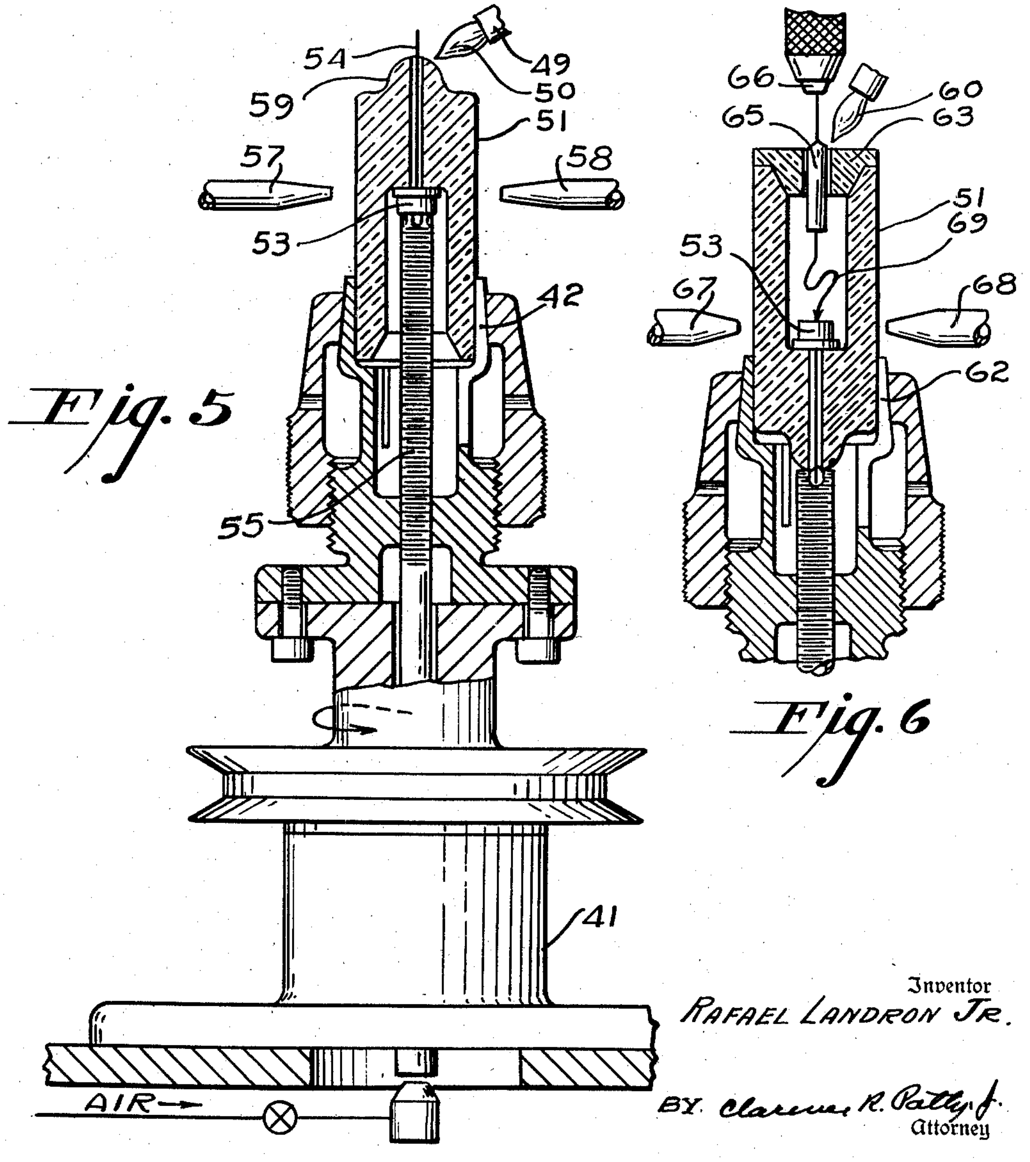
Fig. 5 is a sectional view taken generally on line 5—5 of Fig. 4.
Fig. 6 is a sectional view, similar to Fig. 5, of a fragment of the chuck thereof, containing a diode housing in the inverted position with respect to the showing in Fig. 4, with such housing containing a closure plug having an aperture therethrough through which is passed a support from which depends a point contact (whisker).

Referring to Figs. 4 and 5, the support 41 and its rotatable chuck 42 are similar to those of Fig. 2, as are the nozzles 57, 58 and tube 55 provided for cooling a crystal 53 arranged within the diode housing 51 held by chuck 42. Crystal 53 is attached to the lower end of a conductor 54 and is held against the inner bottom surfaces of housing 51 by tube 55. A flame 50 from a suitable burner 49 is adapted to direct heat toward the protuberance 59 of housing 51 to seal such portion of the housing about conductor 54. If desired cooling fluid may be directed toward the region of the housing occupied by the crystal via nozzles 57 and 58, while a cooling medium is directed against the crystals 54 from tube 55. Ordinarily, however, application of cooling fluid is unnecessary, since the tube 55 is composed of copper and, therefore, conducts heat away from the crystal quite rapidly.

As illustrated in Fig. 6 the housing 51, after having been provided with the crystal 53 in the fashion above described, is inverted and arranged in a chuck 62 similar to chuck 42. The open end of housing 51 is then closed with a plug 63 whose central aperture is occupied with a contact point (whisker) support 65 preferably held by a chuck such as 66 as required to obtain the exact desired pressure of the supported contact point 69 (whisker) against the crystal 53. As the chucks 66 and 62 are rotated, a flame 60 directs the necessary heat into plug 63 to seal it about rod 65 and to the adjoining housing surface to completely hermetically seal the housing interior from atmosphere. Although not ordinarily required, if desired, cooling fluid may be directed toward the region of the housing occupied by crystal 53 and to the first sealed end of the housing during sealing in an obvious fashion to positively assure that the crystal temperature will remain well below that safely permissible.

I claim:

1. A transistor comprising a housing of vitreous material having a cavity closed at one end and containing a vitreous member having a plurality of conductors passing therethrough and anchored thereto, one end of such conductors terminating outside the cavity and their other ends terminating short of the closed end of such cavity, a crystal secured to and supported by said conductors at such other ends thereof, and a vitreous member occupying the open end portion of the housing cavity and through which such conductors pass, said latter vitreous member being joined along a continuous perimeter portion to said housing and sealed about each conductor passing therethrough to hermetically seal the interior of the housing from the exterior atmosphere.

2. A transistor such as defined by claim 1 wherein the surface of the housing wall bounding its cavity has a cut-back forming a ledge engaged by one end of the first defined vitreous member, and wherein the second defined vitreous member occupies that portion of the housing cavity extending between such first defined vitreous member and the open end of the housing.

3. A transistor such as defined by claim 1 wherein the latter vitreous member is made of a material having a lower softening point than that from which the housing is made.

4. The method of manufacturing a transistor, which comprises, passing conductors through the respective passages of a multi-passage bead of vitreous material, firing the bead sufficiently to anchor the conductors thereto, joining one end of the conductors to a crystal, supporting the bead within the cavity of a vitreous housing with the crystal in a position depending from the bead and the free ends of such conductors projecting above the top end of such housing, arranging a bead similar to the first about such conductors in the cavity portion of the housing above such first bead, and firing the upper end of the housing and the latter bead to close its passages and to seal its outer boundary to the housing.

5. A method such as defined by claim 4 which includes extracting heat from the region of the crystal during the firing.

6. A method such as defined by claim 5 which includes directing a cooling fluid against the bottom end of the housing during such firing.

7. The method of manufacturing a transistor, which comprises providing a vitreous housing open at one end and having a cavity which is of reduced cross-section in the bottom region thereof, providing a multi-passage bead adapted to occupy the housing cavity area immediately above the reduced cross-section region thereof, providing a second relatively short multi-passage bead adapted to rest on said first bead and to fill the remainder of the housing cavity, projecting electrical conductors through the passages of the first defined bead, firing the latter bead sufficiently to anchor the conductors thereto, joining a crystal to one end of the conductors, introducing such bead into the housing crystal end first so that the crystal occupies the reduced cross-section cavity region thereof, threading the second defined bead over the free ends of such conductors and arranging it within the housing, and finally firing the latter bead and the upper end of the housing to close such bead passages and form a hermetic seal between the border of such bead and the housing.

References Cited in the file of this patent

UNITED STATES PATENTS

| | | |
|---|---|---|
| 2,595,475 | McLaughlin | May 6, 1952 |
| 2,697,309 | Gates | Dec. 21, 1954 |
| 2,697,805 | Collins | Dec. 21, 1954 |
| 2,697,806 | Gates | Dec. 21, 1954 |
| 2,699,594 | Bowne | Jan. 18, 1955 |